US012632627B2

(12) United States Patent
Nagar et al.

(10) Patent No.: US 12,632,627 B2
(45) Date of Patent: May 19, 2026

(54) CIRCUIT IMPLEMENTATION ON PROCESSING CIRCUITRY

(71) Applicant: Altera Corporation, San Jose, CA (US)

(72) Inventors: Krishna Kumar Nagar, Union City, CA (US); Nathan Krueger, Kalispell, MT (US); Yi Peng, Newark, CA (US); Brandon Lewis Gordon, Campbell, CA (US); Anand Venkitasubramani, Bangalore (IN)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 18/077,187

(22) Filed: Dec. 7, 2022

(65) Prior Publication Data

US 2023/0108339 A1     Apr. 6, 2023

(51) Int. Cl.
*G06F 30/327* (2020.01)
*G06F 30/20* (2020.01)
*G06F 30/3308* (2020.01)
*G06F 30/331* (2020.01)
*G06F 30/3323* (2020.01)
*G06F 30/337* (2020.01)
*G06F 30/34* (2020.01)

(52) U.S. Cl.
CPC ........ *G06F 30/327* (2020.01); *G06F 30/3308* (2020.01); *G06F 30/3323* (2020.01); *G06F 30/20* (2020.01); *G06F 30/331* (2020.01); *G06F 30/337* (2020.01); *G06F 30/34* (2020.01)

(58) Field of Classification Search
CPC .............. G06F 30/327; G06F 30/3323; G06F 30/3308; G06F 30/331; G06F 30/337; G06F 30/34; G06F 30/374; G06F 30/20
USPC ..... 716/103, 104, 116, 121, 132; 703/15, 20
See application file for complete search history.

(56) References Cited

U.S. PATENT DOCUMENTS

| | | | | | |
|---|---|---|---|---|---|
| 5,764,076 | A | * | 6/1998 | Lee | G06F 30/34 |
| | | | | | 326/38 |
| 6,963,966 | B1 | * | 11/2005 | Carrillo | G06F 15/7867 |
| | | | | | 716/117 |
| 10,833,679 | B2 | | 11/2020 | Clark et al. | |
| 2004/0103086 | A1 | * | 5/2004 | Vinnakota | G06F 9/3004 |
| 2016/0049941 | A1 | | 2/2016 | How et al. | |
| 2017/0323032 | A1 | * | 11/2017 | Datta | G06F 30/394 |

(Continued)

FOREIGN PATENT DOCUMENTS

| | | | | | | |
|---|---|---|---|---|---|---|
| CN | 111512296 | A | * | 8/2020 | | G06F 8/47 |
| FR | 3074931 | A1 | * | 6/2019 | | G06F 15/7871 |

(Continued)

*Primary Examiner* — Phallaka Kik
(74) *Attorney, Agent, or Firm* — Fletcher Yoder, P.C.

(57) ABSTRACT

Systems or methods of the present disclosure may provide efficient circuit implementation on processing circuitry. The processing circuitry may include a processor, a programmable hardware, or both. The systems and methods may include determining and removing unused and/or redundant portions of predefined software and hardware description instructions before implementing associated circuitry. The implemented circuitry may perform various functions including parsing, pipelining, deparsing, temporary storage and combining, math operations, or a combination thereof, among other things.

20 Claims, 6 Drawing Sheets

(56) References Cited

U.S. PATENT DOCUMENTS

| | | | | |
|---|---|---|---|---|
| 2017/0323045 A1* | 11/2017 | Huang | .................... | G06F 30/34 |
| 2020/0042664 A1* | 2/2020 | Lee | .......................... | G06F 30/31 |
| 2020/0285985 A1* | 9/2020 | Javadiabhari | .......... | G06N 10/80 |
| 2020/0349236 A1* | 11/2020 | Chen | ....................... | G06F 30/30 |
| 2021/0181977 A1* | 6/2021 | Han | ...................... | G06F 3/0683 |
| 2022/0050946 A1* | 2/2022 | Lee | .......................... | G06F 30/33 |
| 2022/0116041 A1 | 4/2022 | Kumashikar et al. | | |
| 2023/0010147 A1* | 1/2023 | Liu | ....................... | G06F 16/213 |
| 2023/0393849 A1* | 12/2023 | Kotra | ................... | G06F 9/3877 |
| 2023/0394122 A1* | 12/2023 | Bhunia | .................. | G06F 21/76 |
| 2024/0029786 A1* | 1/2024 | Nair | ...................... | G06N 3/063 |
| 2024/0126552 A1* | 4/2024 | Kalamatianos | ..... | G06F 9/30043 |

FOREIGN PATENT DOCUMENTS

| | | | | |
|---|---|---|---|---|
| JP | 2004032043 A | * | 1/2004 | |
| WO | WO-2011156741 A1 | * | 12/2011 | ........... G06F 30/327 |

* cited by examiner

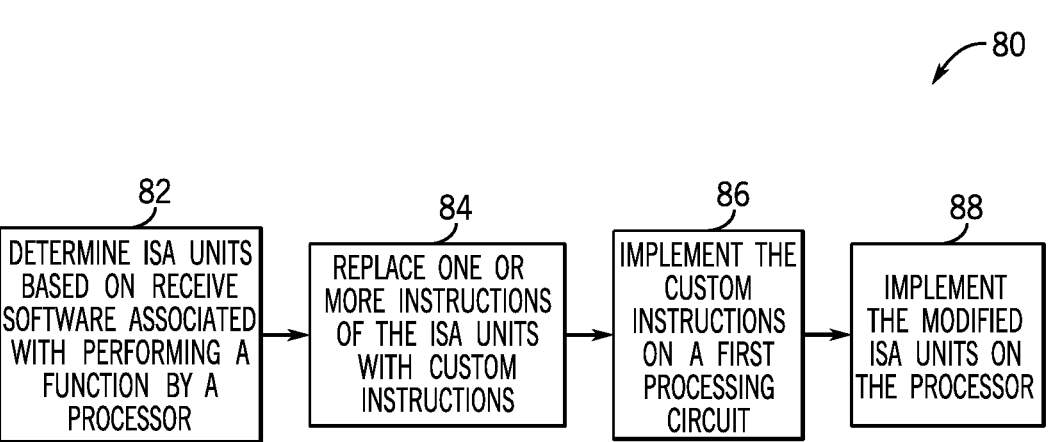

80

| 82 | 84 | 86 | 88 |
|---|---|---|---|
| DETERMINE ISA UNITS BASED ON RECEIVE SOFTWARE ASSOCIATED WITH PERFORMING A FUNCTION BY A PROCESSOR | REPLACE ONE OR MORE INSTRUCTIONS OF THE ISA UNITS WITH CUSTOM INSTRUCTIONS | IMPLEMENT THE CUSTOM INSTRUCTIONS ON A FIRST PROCESSING CIRCUIT | IMPLEMENT THE MODIFIED ISA UNITS ON THE PROCESSOR |

FIG. 4

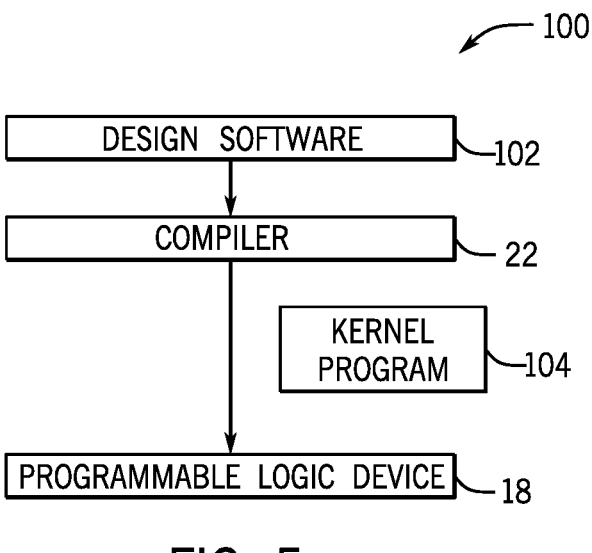

100

DESIGN SOFTWARE — 102

COMPILER — 22

KERNEL PROGRAM — 104

PROGRAMMABLE LOGIC DEVICE — 18

FIG. 5

CIRCUIT IMPLEMENTATION ON PROCESSING CIRCUITRY

BACKGROUND

The present disclosure relates generally to processing circuitry such as processors and programmable logic devices. More particularly, the present disclosure relates to circuit implementation on processors and programmable logic devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

An electronic device may include a processor, a programmable logic device, or both each including programmable circuitry. The processor and/or the programmable logic device may be programmed to implement one or more logic designs for performing a desired function. For example, the electronic device may program the processor and/or the programmable logic device based on a software and/or binary data. Moreover, the electronic device may include memory and/or storage including predefined instructions. The predefined instructions may define an intermediary between the software and/or binary data and the implemented core logic designs. Accordingly, a compiler may utilize the predefined instructions to implement the logic designs. However, such predefined instructions may include extraneous instructions redundant and/or not used for performing the desired function.

For example, high level or coarse grain decisions may cause implementation of unnecessary area consumption on the processor. Such decisions may include choosing different variants of a given processor family, enabling/disabling large optional features, or enabling/disabling entire Instruction Set Architecture (ISA) units. The ISA units may define a bundle of instructions having their respective architectures implemented in a processor. For example, the processors using specific types of ISA units (e.g., RISC-V ISA units) may include bundled instructions to in pull in broad swaths of functionality. However, in some cases, only a relatively small subset of the instructions contained in each extension is leveraged in a software application. Likewise, a compiler may cause logic blocks to be implemented on a logic programmable device based on a predefined library of such blocks. However, some functions in these "off the rack" logic implementations may be unused in particular implementations causing an inefficient use of resources in the programmable logic device.

BRIEF DESCRIPTION OF THE DRAWINGS

Various aspects of this disclosure may be better understood upon reading the following detailed description and upon reference to the drawings in which:

FIG. 4 depicts a process to modify one or more ISA units for performing desired functions intended for the processor of FIG. 1 multiple processing circuitry, in accordance with an embodiment of the present disclosure;

FIG. 5 illustrates a block diagram of a system used to configure a programmable logic device of FIG. 1, in accordance with an embodiment of the present disclosure;

DETAILED DESCRIPTION OF SPECIFIC EMBODIMENTS

Figure 1:
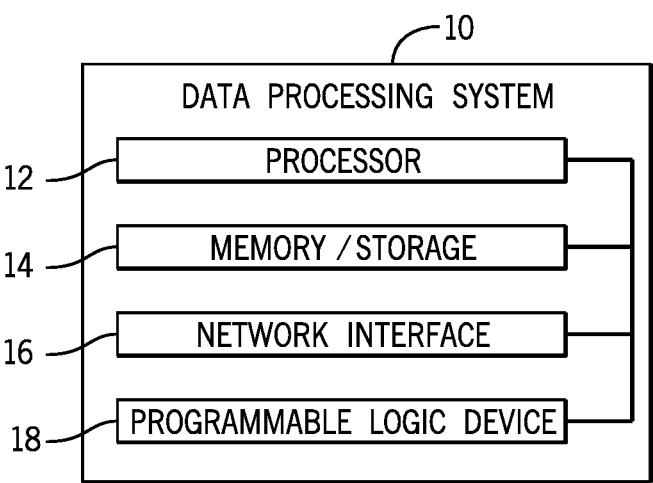
FIG. 1 is a block diagram of a data processing system including a processor with an integrated programmable fabric unit, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure describes systems and techniques related to efficient circuit implementation on processing circuitry. For example, the processing circuitry may include one or more processors and/or programmable logic devices. Moreover, the implemented circuitry may perform various functions including parsing, pipelining, deparsing, temporary storage and combining, math operations, or a combination thereof, among other things.

Typically, as noted previously, coarse grain decisions (e.g., whether to include an ISA) about a processor variant may not consider the possibility of removing individual unused and/or redundant instructions from the base ISA units before implementation on a processor. If not compensated for, additional processor area consumed by the ISA units may be left unusable without optimization. Moreover, multiple instructions may be implemented and/or used bundled together where only a relatively small subset of the bundle is used to cause the processor to perform a functionality. For example, the smallest possible processor variant supporting a complete base ISA unit may be further shrunken if only a subset of the base ISA is implemented in the processor. Consider the case where one instruction out of an ISA unit including 10 bundled instructions is required for a given application. With the current methods, the ISA unit may be enabled and all 10 bundled instructions may be physically realized, consuming unnecessary area even though 90% of the bundled instructions are unused.

Programmable logic devices may also use an industry standard specification defining a packet processing pipeline (e.g., P4, C language, a simpler-than-C language, among other things). Packet processing behavior is defined in such industry standard codes for performing a function. Moreover, predefined register transfer level (RTL) blocks may reflect a received code for implementation on the data plane at powerup. Implementing elements in the predefined RTL blocks may cause the programmable logic device to behave according to the received code (e.g., a received P4 code). The predefined packet processing pipeline in fixed function hardware implementations such as ASIC may provide a superset of capabilities and the received code may utilize a subset of such capabilities. For example, the predefined packet processing pipeline, among other predefined packet processing blocks, may cause implementation of extraneous logic blocks on the programmable logic device. Such implementation may consume additional area and/or electrical power without contribution to the function.

With the foregoing in mind, FIG. 1 depicts a data processing system 10 (e.g., an integrated circuit) including processing circuitry. The data processing system 10 may include a processor 12 (e.g., a host processor), a memory 14 (e.g., memory and/or storage circuitry), and a network interface 16. The data processing system 10 may include more or fewer components (e.g., electronic display, user interface structures, application specific integrated circuits (ASICs)).

The processor 12 may include any suitable processor, such as a central processing unit, microprocessor, graphics processing unit, etc., that may manage a data processing request for the data processing system 10 (e.g., to perform encryption, decryption, machine learning, video processing, voice recognition, image recognition, data compression, database search ranking, bioinformatics, network security pattern identification, spatial navigation, cryptocurrency operations, or the like). In some cases, the processor 12 may include instruction set architectures (ISAs) implemented thereon to receive code programming logic circuitry (e.g., software) for performing a desired function.

The memory 14 may include random access memory (RAM), read-only memory (ROM), one or more hard drives, flash memory, or the like. The memory 14 may hold data to be processed by the data processing system 10. Moreover, the memory 14 may also store configuration programs (bitstreams) for programming a programmable logic device 18 for performing a desired function. The programmable logic device 18 may include an integrated circuit, one or more digital signal processors (DSPs), Field-Programmable Gate Arrays (FPGAs), among other things.

The network interface 16 may allow the data processing system 10 to communicate with other electronic devices.

The data processing system 10 may include several different packages or may be contained within a single package on a single package substrate. For example, components of the data processing system 10 may be located on several different packages at one location (e.g., a data center) or multiple locations. For instance, components of the data processing system 10 may be located in separate geographic locations or areas, such as cities, states, or countries.

In one example, the data processing system 10 may be part of a data center that processes a variety of different requests. For instance, the data processing system 10 may receive a data processing request via the network interface 16 to perform encryption, decryption, machine learning, video processing, voice recognition, image recognition, data compression, database search ranking, bioinformatics, network security pattern identification, spatial navigation, digital signal processing, or some other specialized task.

With the foregoing in mind, software may include code utilizing units of ISA implemented on the processor 12 to perform the desired function. For example, the software may cause at least a portion of the implemented ISA units of the processor 12 to perform the desired function. Each ISA unit may include instructions describing an intermediary between software and processor implemented logic circuitry. Moreover, each predefined ISA unit may include a number of bundled instructions. If not accounted for, based on the predefined and bundled instructions, implementing a predefined ISA unit may result in implementing architecture for extraneous instructions on the processor 12 that are not used in performing the desired function. For example, a processor may analyze a software and/or software image using simulation to determine which predefined ISA units are used for implementation.

Accordingly, the processor 12 may benefit from emulating and/or replacing at least a portion of instructions of one or more predefined ISA units before implementation. In some embodiments, a compiler (e.g., a software compiler tool) may implement a portion of instructions of one or more of the predefined ISA units on the processor 12 to perform a function. The compiler may be executed using a processor 12 of another instantiation of the data processing system 10. In other words, the compiler may be implemented by a processor similar to the processor 12 being designed and/or analyzed via the compiler. In particular, the compiler may perform fine-grain processing (e.g., relatively fine-grain processing) to determine whether one or more instructions of the predefined ISA units is redundant and/or unused to perform an intended function of the processor 12. For example, a processor may analyze the predefined ISA units using simulation to determine which instructions of the predefined ISA units are extraneous instructions before implementation.

Moreover, the compiler may remove such extraneous instructions from the predefined ISA units. Accordingly, the compiler may implement, in a design for the processor 12, a subset of one or more of the predefined ISA units to perform the function. It should be appreciated that the compiler may include any viable software and/or hardware to perform such functions.

Furthermore, the data processing system 10 may use or include a compiler associated with implementing logic circuit on a DSP, FPGA, or any other viable circuitry of the programmable logic device 18. For example, a processing system may include a software compiler to implement the ISA units in a design for the processor 12, a compiler to implement logic circuit on the programmable logic device 18, or both. In specific embodiments, the processor 12 or another processor may be used to implement the software compiler, the logic circuit compiler, or both.

Moreover, the compilers may use software, hardware description language, or both to perform the described function. For example, the logic circuit compiler may receive input in P4 language, C language, and/or simpler-than-C language to perform the described functions. Embodiments associated with the software compiler and the logic circuit compiler is described in more details below. The software compiler and the logic circuit compiler may be referred to as the compiler hereinafter. FIGS. 2-5 described below may describe processes for generating a design for implementation on the processor 12 based on removing one or more extraneous instructions of the predefined ISA units, as will be appreciated.

Figures 2, 3:
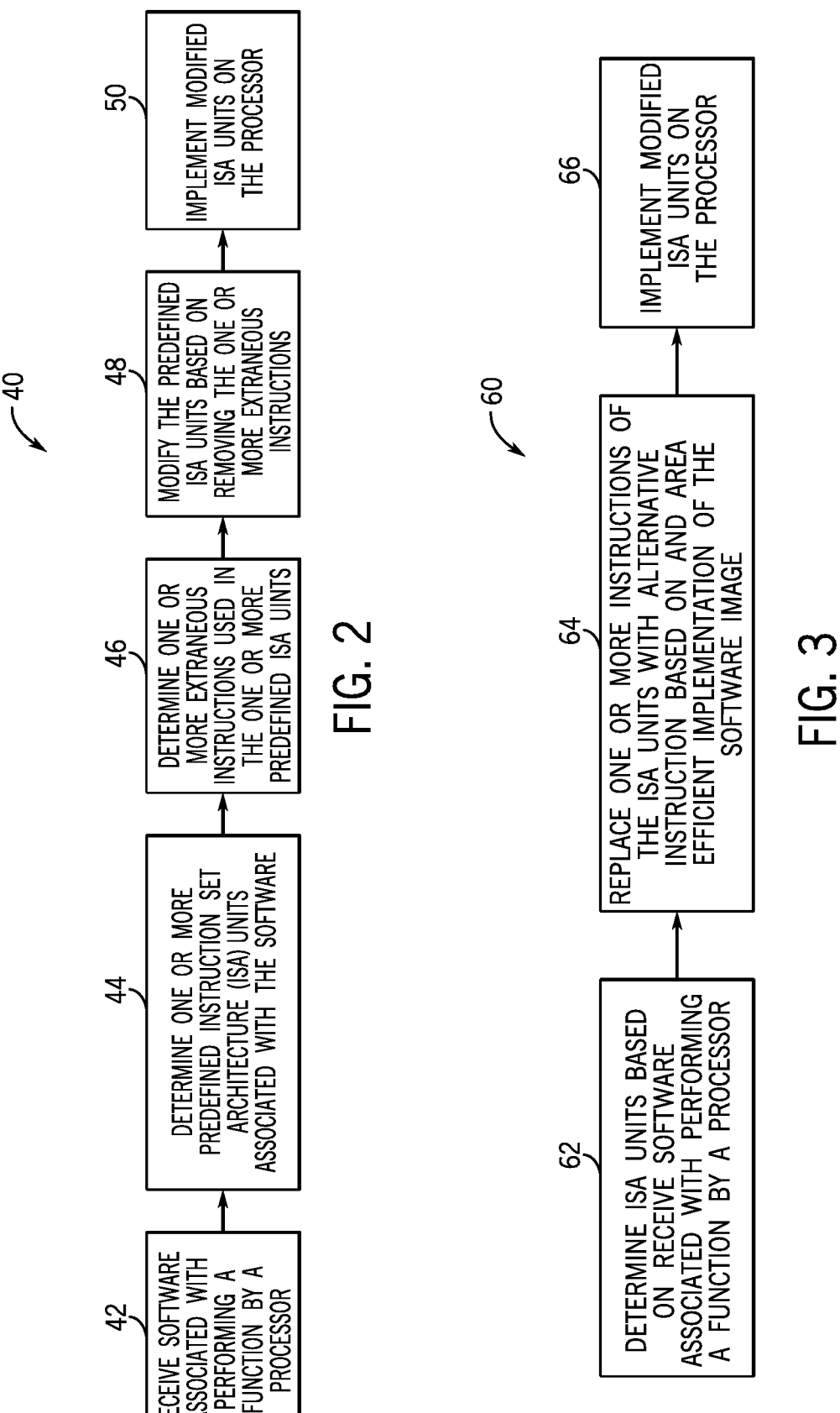
FIG. 2 depicts a process for modifying an instruction set architecture (ISA) unit based on an input software before implementation on the processor of FIG. 1, in accordance with an embodiment of the present disclosure.
FIG. 3 depicts a process to modify one or more ISA units for implementation on a desired processor area of the processor of FIG. 1, in accordance with an embodiment of the present disclosure.

With the foregoing in mind, FIG. 2 depicts a process 40 for modifying one or more predefined ISA units based on a software image before implementation on the processor 12. The processor 12 may benefit from trimming down unused and/or redundant circuitry when implementing predefined ISA units for performing a function. For example, a processor and/or compiler running on the processor may implement the ISA units (e.g., predefined ISA units, modified ISA units, or both) in a design for the processor 12. In particular, the process 40 describes omitting extraneous instructions of one or more predefined ISA units. As such, the process 40 describes efficient use of resources of the processor 12 by tailoring the design of the processor 12 to perform a function associated with the software.

At block 42, the compiler may receive software or a software image associated with performing a desired function by the processor 12. For example, the compiler/processor may receive (e.g., from a user) the software directly or receive an indication (e.g., a location) of the software. Moreover, a processor (e.g., a first processor) of a computing system may access a number of predefined ISA units stored in memory for use in processor designs. At block 44, the compiler may determine one or more predefined ISA units to be implemented in the processor 12 based on the received software or software image. For example, the compiler may refer to the memory 14 to determine the one or more predefined ISA units are used by analyzing the software image based on receiving the software and accessing the predefined ISA units.

In other words, the software image may be used to determine resource utilization of the processor 12 based on the received software and the predefined ISA units. As mentioned above, the predefined ISA units may include a bundle of instructions to perform multiple functions. However, usually at least some of those functions from a predefined ISA unit is not used in a specific implementation using the software leading to additional ISA overhead in the processor that is not used by the software. For instance, if an ISA is implemented in the processor 12 for a particular function (e.g., a single function) out of the bundle of functions (e.g., eleven functions), there may be a relatively large overhead for that single function by including the other (e.g., ten) functions.

At block 46, the compiler may determine one or more extraneous instructions of the predefined ISA units. The processor 12 and/or the compiler may include the software image analyzer and/or the compile may be a design software package that includes both the compiling functions and the software image analyzing functions. For example, the compiler may determine whether one or more instructions of different predefined ISA units are combinable to omit redundant instructions. Alternatively or additionally, the compiler may determine whether one or more instructions of one or more of the predefined ISA units is unused for performing the desired function and is removable.

At block 48, the compiler may modify the predefined ISA units by removing the one or more extraneous instructions from the predefined ISA units. As such, the compiler may provide modified ISA units based on modifying the predefined instructions of the ISA units. In some embodiments, the compiler may provide control parameters disabling the extraneous instructions of one or more predefined ISA units. Alternatively or additionally, the control parameters may indicate used instructions with the compiler omitting unused and/or redundant instructions of the predefined ISA units from a design for the processor 12.

The modified ISA units may indicate implementing instructions on the processor 12 to perform the function with reduced resource consumption (e.g., less logic circuitry). Accordingly, modifying a predefined ISA unit by the compiler and/or any other viable circuitry may improve efficient use of resources of the processor 12 by removing ISA instructions for unused or redundant functions.

Subsequently, at block 50, the compiler may implement the modified ISA units on the processor 12 (e.g., a second processor). For example, the compiler may cause the design to be manufactured with the streamlined design with at least one modified ISA unit. In other words, the processor 12 may be implemented with reduced footprint based on the modified ISA units having reduced resources (e.g., logic circuit). Additionally or alternatively, in some cases, the processor 12 may be capable of executing the software with increased processing speed (e.g., with a higher clock rate), reduced electric power consumption, or both to perform the function of the software.

It should be appreciated that in different embodiments, additional or alternative process blocks may be performed by the compiler or other viable circuitry to modify the predefined ISA units of an input software before implementation on the processor 12. Moreover, although the process blocks are described in a particular order, the process blocks may be performed in any viable manner. Furthermore, the process 40 may be performed by any viable electronic device during manufacturing of the processor 12, before running the received software or software image, after running the received software or software image, and so on.

FIG. 3 depicts a process 60 to modify the ISA units for implementation on a desired processor area of the processor 12. At block 62, the compiler may determine ISA units based on a received software to perform a desired function. Moreover, the compiler may receive or determine a desired section of the processor to implement circuitry including a number of resources of the processor 12 for performing the desired function. The received software may be associated with performing a function by the processor 12. The ISA units may be determined based on the predefined ISA units as discussed above.

At block 64, the compiler may replace one or more instructions of the software with alternative instructions to provide a modified software image. The alternative instructions may be equivalent or substantially equivalent (e.g., achieve the same result) to the one or more instructions being replaced. For example, if an instruction A performs function A in a single clock cycle while instruction B performs function A and B in single clock cycle, instruction A may be omitted and replaced with instruction B. Moreover, the compiler may provide the alternative instructions based on an area efficient implementation of the ISA units on the processor 12. For example, the compiler may provide the alternative instructions for implementation of the ISA units on a particular (e.g., predetermined) area of the processor 12. In some embodiments, replacing instructions of one or more ISA units with may be performed by removing the one or more ISA units from the design for the processor 12 and/or modifying the software to call the replacement functions.

At block 66, the compiler may implement the modified ISA units on the processor 12. For example, such modified ISA units may include a more efficient use of resources in the processor 12 for executing the software. Any corresponding changes to the software may increase or decrease the amount of binary bits in the code. In any case, the compiler may implement the modified ISA units on the particular (e.g., predetermined) area of the processor 12 mentioned above to provide area efficient circuit implementation.

The process 60 may be performed in combination or exclusive from the process 40 described above. It should be appreciated that in different embodiments, additional or alternative process blocks may be performed by the compiler or other viable circuitry to modify the software image of an input software before implementation on the processor 12. Moreover, although the process blocks are described in a particular order, the process blocks may be performed in any viable manner. Furthermore, the process 60 may be performed by any viable electronic device during manufacturing of the processor 12, before running the received software or software image, after running the received software or software image, and so on.

FIG. 4 depicts a process 80 to modify the ISA units for performing the functions by a first processing circuitry and a second processing circuitry. For example, the first processing circuitry may include the processor 12. Moreover, the second processing circuitry may include one or more hardened functional circuit block, such as a DSP block, among other things of a programmable fabric of the programmable logic device 18.

At block 82, the compiler may determine the ISA units based on receiving the software or an indication of the software for performing a function. At block 84, the compiler may replace one or more instructions of the ISA units with custom instructions that specify application-specific behavior without breaking the compliance of the main specification for the processor 12. For example, such custom instructions may be associated with hardened functional blocks of a programmable logic block. For instance, the DSP block may support multiplication and accumulation in a single clock cycle. If there is a sequence of multiplication and addition related instructions, the compiler may replace the sequence with a custom instruction using a DSP block. In some embodiments, the compiler may modify the hardware of the processor 12 by inserting and/or enabling custom instructions to replace the functionality of a predefined ISA unit to increase operation efficiency and/or reduce area. In alternative or additional embodiments, the compiler may modify the software image to replace an instruction or sequence of instructions with alternative instructions or sequences of instructions. Then, the separate multiplication and addition related instructions may be removed from one or more of the ISA units before implementation in the processor 12. Moreover, the custom instructions may be provided using software instructions, any variation of low-level hardware description languages (HDL), high-level languages (e.g., OpenCL), or a combination of both.

At block 86, the compiler may implement the custom instructions on a first processing circuit (e.g., a FPGA, one or more DSPs, among other things). Moreover, at block 88, the compiler may implement the modified ISA units on a second processing circuit (e.g., the processor 12). In other words, the function being replaced may be shifted from the second processing circuit (e.g., the processor 12) to the first processing circuit (e.g., an FPGA). This shift may be performed by changing the software and/or changing the architecture of the first and/or second processing circuit to route a call for the function for the second processing circuit to perform the function to the first processing circuit instead.

The process 80 may be performed in combination or exclusive from the processes 40 and 60 described above. It should be appreciated that in different embodiments, additional or alternative process blocks may be performed by the compiler or other viable circuitry to modify the software image of an input software before implementation on the processor 12. Moreover, although the process blocks are described in a particular order, the process blocks may be performed in any viable manner. Furthermore, the process 80 may be performed by any viable electronic device during manufacturing of the processor 12, before running the received software or software image, after running the received software or software image, and so on.

As mentioned above, the programmable logic device 18 may include one or more programmable fabrics such as FPGAs and DSPs. FIG. 5 illustrates a block diagram of a system 100 used to configure the programmable logic device 18. A designer may implement functionality on an integrated circuit, such as the programmable logic device 18 that includes some reconfigurable circuitry, such as an FPGA. A designer may implement a circuit configuration (e.g., logic circuitry) to be programmed onto the programmable logic device 18 using design software 102 (or design code), such as a version of Quartus by Intel®. The design software 102 may use a compiler 22 to generate a low-level circuit-design, which may be provided as a kernel program 104, sometimes known as a program object file or bitstream, that programs the programmable logic device 18. The compiler 22 to generate the low-level circuit-design based on one or more predefined libraries. For example, the compiler 22 may refer to the memory 14 to access such predefined libraries, as will be appreciated. That is, the compiler 22 may provide machine-readable instructions representative of the circuit design to the programmable logic device 18.

Figure 6:
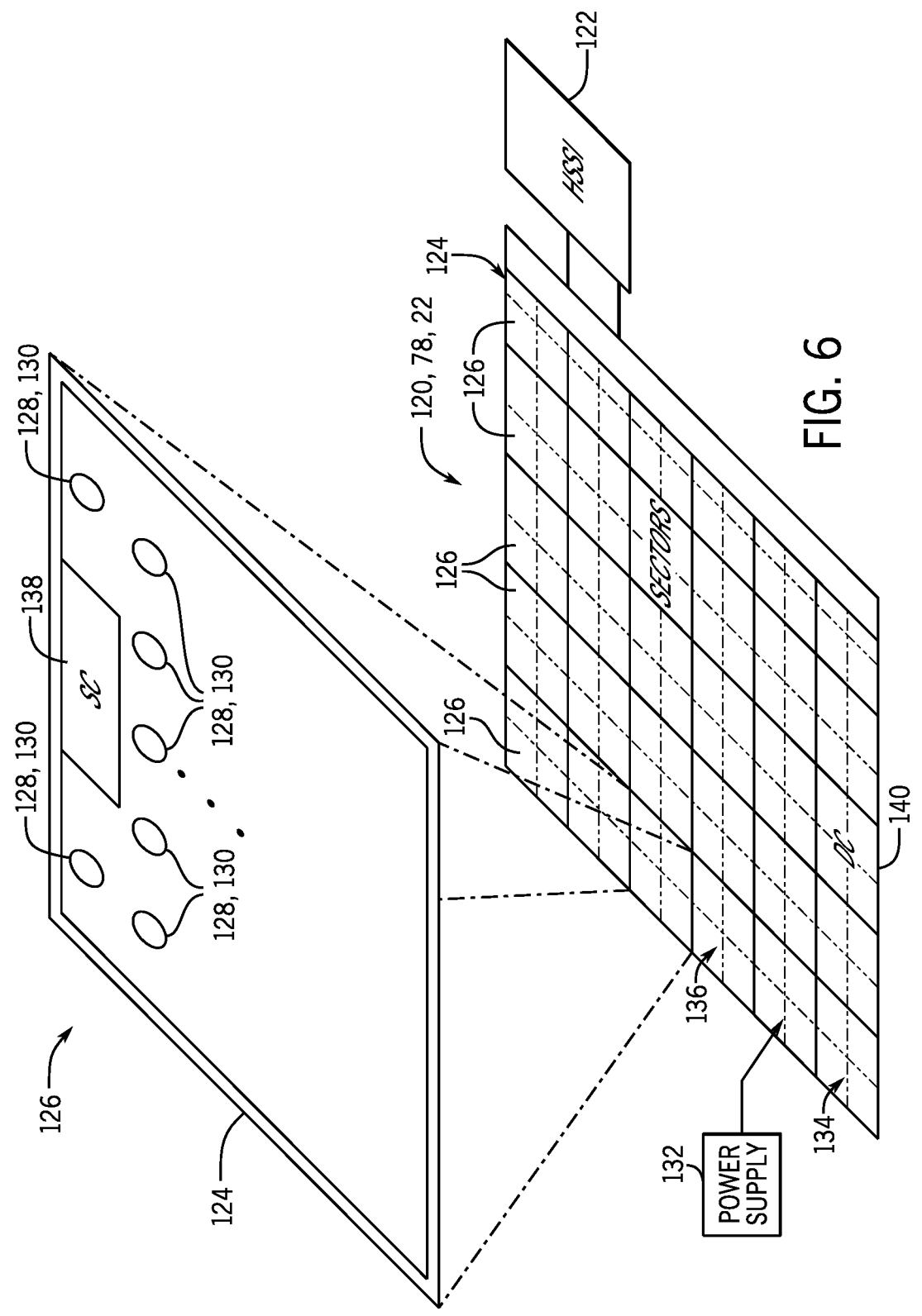
FIG. 6 depicts a Field-Programmable Gate Array (FPGA) FIG. 6 of the programmable logic device of FIG. 1, in accordance with an embodiment of the present disclosure.

FIG. 6 depicts a FPGA 120 of the programmable logic device 18. For the purposes of this example, the FPGA 120 is referred to as an FPGA, though it should be understood that the device may be any suitable type of programmable logic device (e.g., an application-specific integrated circuit, application-specific standard product, and/or one or more DSPs). In one example, the FPGA 120 is a sectorized FPGA of the type described in U.S. Patent Publication No. 2016/0049941, "Programmable Circuit Having Multiple Sectors," which is incorporated by reference in its entirety for all purposes. The FPGA 120 may be formed on a single plane. Additionally or alternatively, the FPGA 120 may be a three-dimensional FPGA having a base die and a fabric die of the type described in U.S. Pat. No. 10,833,679, "Multipurpose Interface for Configuration Data and User Fabric Data," which is incorporated by reference in its entirety for all purposes.

In the example of FIG. 6, the FPGA 120 may include a transceiver 122 that may include and/or use input-output circuitry for driving signals off the FPGA 120 and for receiving signals from other devices. In some embodiments, the transceiver 122 may output compile time parameters and/or options for implementing predefined RTL blocks, as will be appreciated. Interconnection resources 124 may be used to route signals, such as clock or data signals, through the FPGA 120. The FPGA 120 of FIG. 6 is sectorized, meaning that programmable logic resources may be distributed through a number of discrete programmable logic sectors 126. Each programmable logic sector 126 may include a number of programmable logic elements 128 having operations defined by configuration memory 130 (e.g., configuration random access memory (CRAM)). In some cases, the FPGA 120 may include a number of voltage islands. In such cases, each voltage island may include a number of programmable logic sectors 126.

The programmable logic elements 128 may include (e.g., implement) combinational or sequential logic circuitry. For example, the programmable logic elements 128 may include look-up tables, registers, multiplexers, routing wires, and so forth. A designer may program the programmable logic elements 128 to perform a variety of desired functions. A power supply 132 may provide a source of voltage (e.g., supply voltage) and current to a power distribution network (PDN) 134 that distributes electrical power to the various components of the FPGA 120. Operating the circuitry of the FPGA 120 causes power to be drawn from the power distribution network 134.

Moreover, in some cases, the FPGA 120 may include one or more redundancy logic circuits 136 disposed between one or more rows and/or columns of the programmable logic sectors 126. The redundancy logic circuit 136 may include multiple level shifters and MUXs. In some cases, the power distribution network 134 may provide the electrical power to the level shifters and MUXs of the redundancy logic circuit 136. Moreover, in some cases, the redundancy logic circuit 136 may use the level shifters and MUXs to provide multiple voltage levels to different voltage islands of the FPGA 120. In specific cases, the redundancy logic circuit 136 may use different voltage rails and/or voltage pins to provide different voltage levels to the voltage islands of the FPGA 120.

For example, the redundancy logic circuit 136 may use a level shifter to provide a stepped-down voltage level of a voltage received from the power supply 132. Moreover, in some cases, the redundancy logic circuit 136 may receive control bits including instructions for selecting the stepped-down voltage level or the voltage received from the power supply 132. For example, the level shifters may provide a voltage level to one or multiple voltage islands based on receiving the control bits. Accordingly, the redundancy logic circuit 136 may use the level shifters to provide different voltage levels to different voltage islands during operation of the FPGA 120. As such, in some cases, the redundancy logic circuit 136 may efficiently use lower electric power based on providing the stepped-down voltage level of the power supply 132 to at least a portion of the FPGA 120 (e.g., at least one voltage island) during operation.

In any case, there may be any suitable number of programmable logic sectors 126 on the FPGA 120. Indeed, while 29 programmable logic sectors 126 are shown here, it should be appreciated that more or fewer may appear in an actual implementation (e.g., in some cases, on the order of 50, 100, 500, 1000, 5000, 10,000, 50,000, or 100,000 sectors or more). Each programmable logic sector 126 may include a sector controller (SC) 138 that controls the operation of the programmable logic sector 126. Each sector controller 138 may be in communication with a device controller (DC) 140.

Each sector controller 138 may accept commands and data from the device controller 140 and may read data from and write data into its configuration memory 130 based on control signals from the device controller 140. In addition to these operations, the sector controller 138 may be augmented with numerous additional capabilities. For example, such capabilities may include locally sequencing reads and writes to implement error detection and correction on the configuration memory 130 and sequencing test control signals to effect various test modes.

The sector controllers 138 and the device controller 140 may be implemented as state machines and/or processors. For example, each operation of the sector controllers 138 or the device controller 140 may be implemented as a separate routine in a memory containing a control program. In some cases, the sector controllers 138 may generate and/or provide the control bits to one or multiple components of the FPGA, such as the level shifters. This control program memory may be fixed in a read-only memory (ROM) or stored in a writable memory, such as random-access memory (RAM).

The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 126. This may provide usable extensibility in an efficient and easily understood way. This may be useful because new commands could bring about large amounts of local activity within the sector at the expense of only a small amount of communication between the device controller 140 and the sector controllers 138.

Each sector controller 138 thus may communicate with the device controller 140, which may coordinate the operations of the sector controllers 138 and convey commands initiated from outside the FPGA 120. To support this communication, the Interconnection resources 124 may act as a network between the device controller 140 and each sector controller 138. The interconnection resources may support a wide variety of signals between the device controller 140 and each sector controller 138. In one example, these signals may be transmitted as communication packets.

The compiler 22 may electrically program the FPGA 120. With electrical programming arrangements, the programmable logic elements 128 may include one or more logic elements (wires, gates, registers, etc.). For example, during programming, configuration data is loaded into the configuration memory 130 using pins and input/output circuitry. In one example, the configuration memory 130 may be implemented as configuration random-access-memory (CRAM) cells. As discussed below, in some embodiments, the configuration data may be loaded into the FPGA 120 using an update to microcode of the processor in which the FPGA 120 is embedded.

The use of configuration memory 130 based on RAM technology is described herein is intended to be only one example. Moreover, configuration memory 130 may be distributed (e.g., as RAM cells) throughout the various programmable logic sectors 126 the FPGA 120. The configuration memory 130 may provide a corresponding static control output signal that controls the state of an associated programmable logic element 208 or programmable component of the Interconnection resources 124. The output signals of the configuration memory 130 may be applied to the gates of metal-oxide-semiconductor (MOS) transistors that control the states of the programmable logic elements 128 or programmable components of the Interconnection resources 124.

The sector controllers 138 and/or the device controller 140 may determine when each sector controller 138 performs a CRAM read operation on the configuration memory 130 of its programmable logic sector 126. Each time the sector controller 138 performs a CRAM read of the configuration memory 130, power is drawn from the power distribution network 134. If too much power is drawn from the power distribution network 134 at any one time, the voltage provided by the power distribution network 134 could drop to an unacceptably low level, or too much noise could arise on the power distribution network 134. To avoid this, the device controller 140 and/or the sector controllers 138 may structure CRAM reads of the programmable logic sectors 126 to avoid excessive instantaneous power consumption by temporally and/or spatially distributing the CRAM reads across different programmable logic sectors 126.

The sector controller 138 of the programmable logic sector 126 is shown to read and write to the configuration memory 130 by providing an ADDRESS signal to an address register and providing a memory write signal (WRITE), a memory read signal (RD DATA), and/or the data to be written (WR DATA) to a data register. These signals may be used to cause the data register to write data to or read data from a line of configuration memory 130 that has been activated along an address line, as provided by the ADDRESS signal applied to the address register. Memory read/write circuitry may be used to write data into the activated configuration memory 130 cells when the data register is writing data and may be used to sense and read data from the activated configuration memory 130 cells when the data register is reading data.

Figure 7:
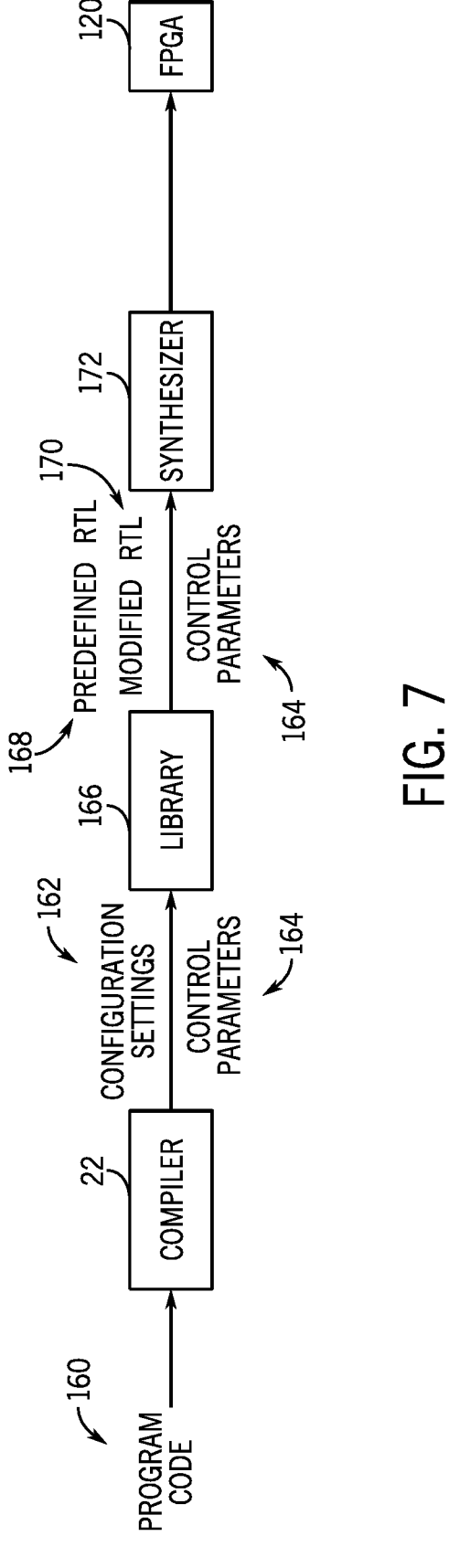
FIG. 7 depicts functional blocks for implementing logic circuit blocks on the FPGA of FIG. 6 based on a program code, in accordance with an embodiment of the present disclosure.

FIG. 7 is a block diagram for implementing predefined logic circuit blocks on the FPGA 120 based on a program code 160. The FPGA 120 may also benefit from trimming down of unused and/or redundant logic circuitry when implementing predefined logic circuit blocks for performing a function. For example, a user may provide the program code 160 to the compiler 22. The program code may include the design software 102 received by the processor 12 discussed above. The program code 160 may be indicative of logic circuit for implementation on the FPGA 120 for performing the function. The compiler 22 may include a P4 compiler and/or any other viable compilers.

Based on receiving the program code 160, the compiler 22 may provide configuration settings 162 (or configuration register settings) with control parameters 164 to a library 166 of predefined register transfer level code (RTL) 168, hereinafter referred to as predefined RTL blocks 168. The control parameters 164 may include compile time parameters and/or input port control settings. For example, the compiler 22 may generate a number of control signals indicative of the configuration settings 162 and/or the constraints (e.g., options) and control parameters 164. Moreover, the memory 14 of the data processing system 10 described above may store objects (e.g., predefined RTL blocks 168) for the library 166. The configuration settings 162 may indicate selection of one or more of the predefined RTL blocks 168 stored in the library 166 for implementation on the FPGA 120 to perform the function.

For example, the library 166 may include predefined RTL blocks 168 associated with implementing corresponding functions using predefined logic circuit blocks on the FPGA 120. Moreover, each predefined RTL block 168 may include a digital description of logic circuit blocks for implementation on the FPGA 120. Furthermore, the control parameters 164 may indicate information regarding constraints (e.g., the input port control settings) for implementing the selected predefined RTL blocks 168. For instance, the constraints or options may indicate that certain functions that may be available in the predefined RTL blocks 168 (e.g., checksum, etc.) are not used in the program code.

In some embodiments, the control parameters 164 (e.g., the compile time parameters) may indicate removing at least a portion of unused and/or redundant code of the selected predefined RTL blocks 168. For example, the control parameters 164 (or options) may indicate removing a checksum feature, removing a portion of the checksum feature, and/or override the checksum feature of a predefined RTL block 168 when the checksum feature is not used. For example, the control parameters 164 may indicate implementing a MUX with a single input value to override the checksum feature. Similarly, the control parameters 164 may indicate removing a header parsing feature or a portion of the header parsing feature of a predefined RTL block 168 when such feature is not used.

In alternative or additional embodiments, the control parameters 164 may indicate disabling one or more or a portion of one or more predefined RTL blocks 168. In such embodiments, the control parameters 164 may indicate disabling the unused checksum feature (or a portion of the unused checksum feature) of the predefined RTL block 168. The compiler 22 may set constant values to an output of the unused functions/logic of the predefined RTL blocks 168 and/or the modified RTL blocks 170. For example, the compiler 22 may set inputs, outputs, and/or selection ports of a MUX to a constant value to cause disabling the MUX by a synthesizer 172. Subsequently, the synthesizer 172 (e.g., a synthesis engine/tool/software) may remove such disabled features.

In yet alternative or additional embodiments, the control parameters 164 may indicate setting (or resetting) one or more compile time parameters to the synthesizer 172 (e.g., a preprocessor of the synthesizer 172) to remove one or more or a portion of one or more predefined RTL blocks 168. In such embodiments, the control parameters 164 may indicate setting compile time parameters of the unused checksum feature (or a portion of the unused checksum feature) of the predefined RTL block 168 such the synthesizer may remove the checksum feature. For example, the control parameters 164 may comment out codes associated with unused and/or redundant features from the predefined RTL blocks 168 and/or the modified RTL blocks 170.

As noted above, the logic circuit blocks may be associated with performing one or more functions, such as parsing, pipelining, and/or deparsing, among other things, when implemented on the FPGA 120 during operation. In some embodiments, the library 166 may remove at least a portion of the selected predefined RTL blocks 168 to provide a modified RTL block 170 based on the constraints and control parameters 164. In additional or alternative embodiments, the synthesizer 172 may remove at least a portion of unused and/or redundant code of the selected predefined RTL blocks 168 and/or the modified RTL block 170 based on the constraints and control parameters 164. As such, the library 166 and/or the synthesizer 172 may implement a portion of one or more of the predefined logic circuit blocks on the FPGA 120 based on the constraints and control parameters 164.

In particular, a predefined RTL block 168 may include code corresponding to implementing a set number of predefined resources (e.g., Verilog code, Very High Speed Hardware Description Language (VHDL) code, a predefined netlist). For example, the predefined RTL block 168 may correspond to implementing a predefined parser, pipeline, and/or deparser logic circuit block, among other logic circuit blocks. In some cases, one or more logic circuit blocks may utilize less resources than the predefined resources of the predefined RTL block 168 due to not using some implemented functions in the RTL blocks 168 that are not used in the design implemented in the FPGA 120. In such cases, the compiler 22 may provide the control parameters 164 such that the library 166 and/or the synthesizer 172 may implement the modified RTL block 170 on the FPGA 120.

For example, a first predefined RTL block 168 may correspond to implementing predefined logic circuit blocks with resources for parsing and/or pipelining a first number (e.g., 64 bytes) of header information, among other possibilities. In some cases, performing a function may include using no header portion or a reduced amount of header information (e.g., 2 bytes, 8 bytes, 32 bytes, among other possibilities). In such cases, the compiler 22 may provide configuration settings 162 selecting the first predefined RTL block 168. Moreover, the compiler 22 may provide the control parameters 164 to remove an extraneous portion of the first predefined RTL block 168. Accordingly, the library 166 and/or the synthesizer 172 may implement the modified RTL block 170 on the FPGA 120.

In some embodiments, the library 166 may provide modified RTL blocks 170 based on receiving the configuration settings 162 along with the control parameters 164 that are already stored in the library 166 or may generate the modified RTL blocks 170 after receiving the configuration settings 162. Additionally or alternatively, in some cases, the library 166 may provide the predefined RTL block 168 and/or the modified RTL blocks 170 along with the control parameters 164 to the synthesizer 172. In such cases, the synthesizer 172 may implement the logic circuit blocks with reduced circuit blocks (or circuit components) on the FPGA 120 based on receiving the constraints and control parameters 164. Alternatively or additionally, the synthesizer 172 may detect, remove, and/or combine one or more redundant and/or unused circuit blocks without receiving the constraints and control parameters 164.

In some cases, if the predefined RTL blocks 168 is not trimmed down, the implemented logic circuit blocks may include similar circuit blocks having redundant functionality. For example, multiple predefined RTL blocks 168 may include code associated with implementing multiple counter circuits on the FPGA. In some embodiments, the compiler 22 may provide the configuration settings 162 with the associated control parameters 164 to modify the predefined RTL blocks 168 to implement one shared counter circuit instead. In some cases, the synthesizer 172 may also detect, remove, and/or combine such redundant circuit blocks to implement one shared counter circuit. In another example, the compiler 22 may provide the configuration settings 162 with the associated control parameters 164 to omit predefined RTL code describing a single input/output multiplexer (MUX), among other possibilities. For example, the compiler 22 may provide a constant value to be applied to a MUX select signal, which may retain a logic driven at the input of the mux while removing the MUX. In this way, the compiler 22 may retain the logic corresponding to the MUX select signal and remove the logic that is driven on other unselected inputs of the MUX.

In some embodiments, the compiler 22 may include the synthesizer 172 and/or library 166 in a design software application suite/package to implement the logic circuit blocks with reduced circuit blocks (or circuit components) on the FPGA 120. In any case, the resulting logic circuit blocks implemented on the FPGA 120 may occupy less resources, utilize power more efficiently, operate at a higher clock rate, or a combination thereof, based on the omitted unused and/or redundant portions of the circuit blocks. Accordingly, the FPGA 120 may include circuit blocks with high key performance indicators (KPI) for performing the function.

In some embodiments, the compiler 22 may provide the configuration settings 162 with associated control parameters 164 indicative of removing a portion of a predefined RTL block 168. In such cases, the library 166 may provide the modified RTL block 170 based on removing the portion of the predefined RTL block 168. In alternative or additional embodiments, the compiler 22 may provide the configuration settings 162 with associated control parameters 164 indicative of disabling one or more predefined RTL block 168 or one or more portions of a predefined RTL block 168. In such cases, the library 166 may omit provision of a respective modified RTL block 170 and/or predefined RTL block 168. Alternatively or additionally, the library 166 may provide such control parameters 164 such that the synthesizer 172 may omit implementation of a respective modified RTL block 170 and/or predefined RTL block 168.

In yet alternative or additional embodiments, the compiler 22 may provide the configuration settings 162 with associated control parameters 164 indicative of settings for compile time parameters of one or more modified RTL blocks 170 and/or predefined RTL blocks 168. For example, when a data string includes no header or less header data compared to a header parser of a modified RTL block 170 and/or predefined RTL block 168, the compiler 22 may provide the control parameters 164 indicative of removing the respective predefined RTL block 168 and/or a respective modified RTL block 170. As such, the synthesizer 172 may remove a respective predefined RTL block 168 and/or a respective modified RTL block 170.

Figure 8:
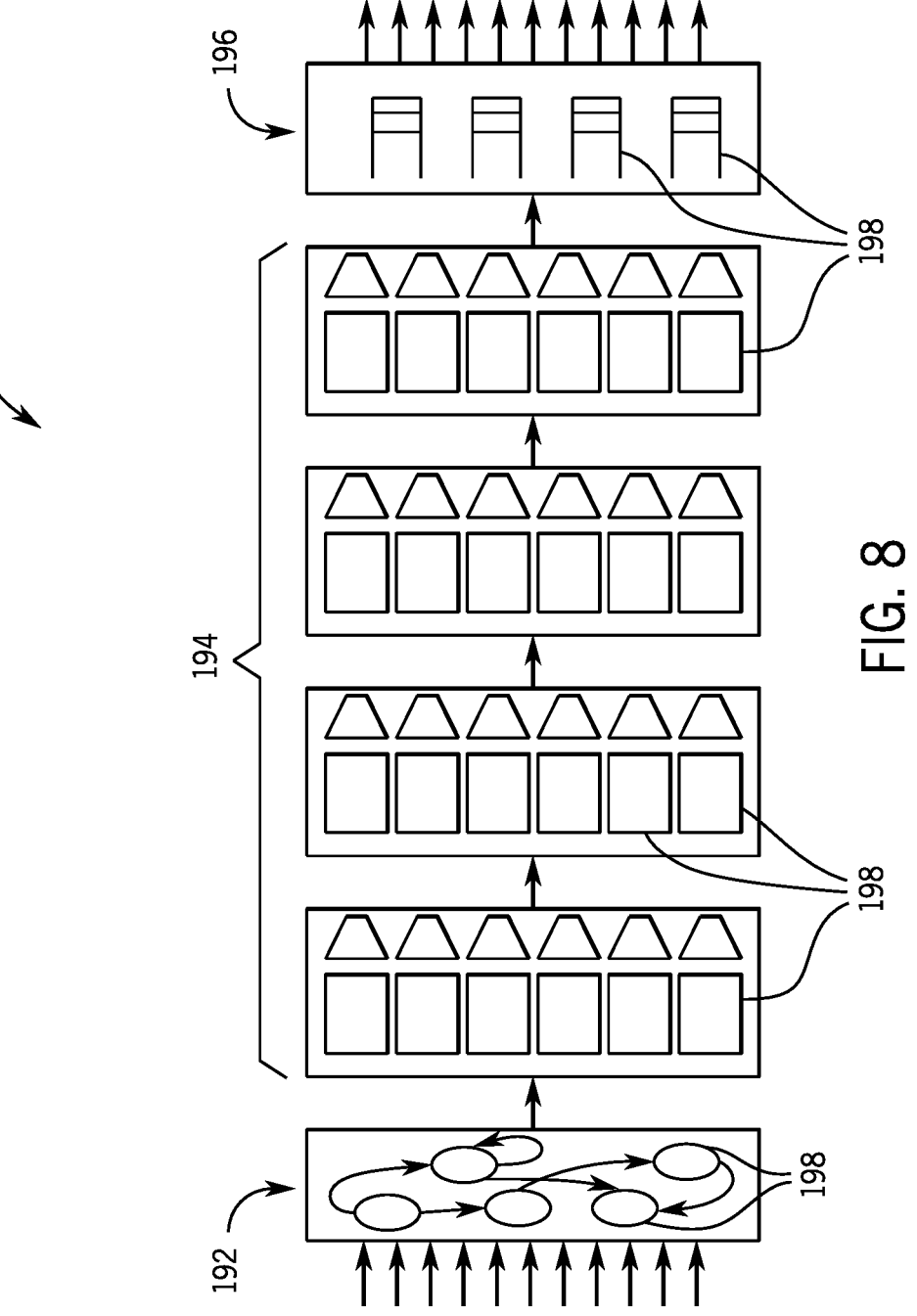
FIG. 8 depicts an example logic circuit implementation process by the system of FIG. 5 and/or parts of the functional blocks of FIG. 7 on the FPGA of FIG. 6 including a parser, a pipeline, and a data register (e.g., a deparser), in accordance with an embodiment of the present disclosure.

FIG. 8 depicts a simplified block diagram of a logic circuit 190 including a parser 192, a pipeline 194, and a data register 196 (e.g., a deparser). The logic circuit 190 may include various circuit blocks such as state machines, MUXs, flip-flops, logic gates, among other things. Moreover, the parser 192, the pipeline 194, and the data register 196 may each include a number of logic control elements 198 (e.g., hooks and knobs) for routing and/or processing data (e.g., a packet processing block). Based on determining the modified RTL blocks discussed above, the synthesizer 172 may implement the logic circuit 190 with reduced number of the logic control elements 198 to perform the function.

Referring back to FIG. 7, the compiler 22, the synthesizer 172, or both, discussed above, may modify the RTL blocks for implementing the logic circuit 190 with reduced logic control elements 198. In particular, the compiler 22, the synthesizer 172, or both, may remove one or more extraneous logic control elements 198 of predefined RTL blocks 168 based on determining redundant functionality and/or being unused for performing the desired function. By the way of example, the compiler 22 may provide the configuration settings 162 with the associated control parameters 164 indicative of removing a MUX from a predefined RTL block. Although the example is described with respect to a MUX, the compiler 22 may provide the configuration settings 162 with the associated control parameters 164 for any other circuitry for implementation on the FPGA 120, among other things.

The compiler 22 may provide the configuration settings 162 with associated constraints and control parameters 164 to remove code associated with an unused MUX from such predefined RTL block 168. For example, the configuration settings 162 with associated constraints and control parameters 164 may indicate providing a constant value to be applied to a MUX select signal, which may cause retaining a logic driven at the input of the mux while removing the MUX. In alternative or additional embodiments, the design software 102 may provide the configuration settings 162 with associated constraints and control parameters 164 (e.g., received as input from a user) to the compiler 22, the library 166, and/or the synthesizer 172. In some cases, the library 166 may provide a modified RTL block 170 based on removing the code associated with the single input MUX from predefined RTL block 168 (e.g., replace the single input MUX with a line). In alternative or additional cases, the library 166 may provide a predefined RTL block 168 with control parameters 164 indicative of disabling a predefined RTL block 168 associated with implementing the unused MUX. In such cases, the synthesizer 172 may identify and remove one or more of the unused and/or redundant logic control elements 198 of the predefined RTL blocks 168 for performing the function.

In yet alternative or additional embodiments, the library 166 may provide a predefined RTL block 168 with control parameters 164 indicative of setting run time parameters of the MUX to a single input MUX. For example, the library 166 may provide a constant value to be applied to a MUX select signal, which may cause retaining a logic driven at the input of the mux while removing the MUX. Similarly, in such cases, the synthesizer 172 may identify and remove one or more of the unused and/or redundant logic control elements 198 of the predefined RTL blocks 168 for performing the function. In some cases, the synthesizer 172 may replace the single input MUX with a line. Similarly, the synthesizer 172 may remove portions of a predefined RTL block 168 associated with omitting an unused MUX and/or other omitted circuitry.

The systems and methods described above may provide technical advantages when omitting implementation of unused and/or redundant logic on the processor 12 and/or the programmable logic device 18. For example, the technical advantages may include reduced area consumption, reduced electric power consumption, increased operation speed (e.g., increased clock rate), or a combination thereof, of the processor 12 and/or the programmable logic device 18.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims. The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for

[perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

Example Embodiment 1. A data processing system, comprising:
a memory storing code describing a plurality of predefined instruction set architecture (ISA) units, wherein each ISA unit comprises one or more instructions; and
a first processor executing instructions to:
receive software associated with performing a function using a second processor;
determine one or more predefined ISA units to be used by the second processor based on the software;
determine one or more extraneous instructions of at least one predefined ISA unit of the one or more predefined ISA units based at least in part on the software; and
generate a design for a processor circuit of the second processor by removing the one or more extraneous instructions to cause the second processor to use a reduced-set ISA unit rather than the at least one predefined ISA unit to perform the function by implementing the design.

Example Embodiment 2. The data processing system of embodiment 1, wherein the extraneous instructions comprises unused instructions of the at least one predefined ISA unit for performing the function.

Example Embodiment 3. The data processing system of embodiment 1, wherein the extraneous instructions comprises redundant instructions of the at least one predefined ISA unit associated with performing a redundant function that is capable of being performed using another function corresponding to the at least one predefined ISA unit.

Example Embodiment 4. The data processing system of embodiment 3, wherein removing the redundant instructions comprise removing instructions associated with a redundant circuit block.

Example Embodiment 5. The data processing system of embodiment 4, wherein the redundant circuit block comprises a counter circuit block.

Example Embodiment 6. The data processing system of embodiment 1, wherein generating the design comprises combining at least two instructions into a custom instruction to remove the one or more extraneous instructions.

Example Embodiment 7. The data processing system of embodiment 1, wherein the first processor generates a software image based on receiving the software to determine the one or more predefined ISA units.

Example Embodiment 8. The data processing system of embodiment 1, wherein the first processor generates the design using reduced resources of the second processor compared to implementing unmodified versions of the one or more predefined ISA units on the second processor.

Example Embodiment 9. The data processing system of embodiment 1, wherein the first processor analyzes the software using simulation to determine the one or more predefined ISA units.

Example Embodiment 10. A method, comprising:

storing, by a first processor, code describing a plurality of predefined instruction set architecture (ISA) units, wherein each ISA unit comprises one or more instructions;

receiving, by the first processor, software associated with performing a function on a second processor;

determining, by the first processor, one or more predefined ISA units of the plurality of predefined ISA units to be used by the second processor based at least in part on the received software; and generating, by the first processor, a modified ISA unit based on replacing at least one instruction of at least one predefined ISA unit of the one or more predefined ISA units with one or more alternative instructions to replace a function of the at least one instruction with a function of the one or more alternative instructions when executed on the second processor.

Example Embodiment 11. The method of embodiment 10, wherein the second processor comprises a plurality of resources, and wherein the modified ISA unit is implemented on a portion of the plurality of resources of the second processor associated with the section.

Example Embodiment 12. The method of embodiment 10, comprising simulating the software to determine the one or more predefined ISA units.

Example Embodiment 13. The method of embodiment 10, wherein the processor determines the modified ISA unit based on removing one or more extraneous instructions of the corresponding predefined ISA unit.

Example Embodiment 14. The method of embodiment 13, wherein the extraneous instructions comprise unused instructions, redundant instructions, or both in the ISA unit when performing the function.

Example Embodiment 15. The method of embodiment 10, wherein the second processor generates logic circuitry on the second processor by implementing the modified ISA unit.

Example Embodiment 16. A non-transitory computer-readable medium comprising computer-executable instructions that, when executed, are configured to cause a first processor to:

receive program code associated with performing a first function;

provide first configuration settings and control parameters to a memory based on the program code, wherein the first configuration settings are associated with selecting at least a first predefined register transfer level (RTL) block of one or more predefined RTL blocks stored on a memory, and the control parameters are associated with options associated with removing unused portions of at least the first predefined RTL block based on the program code before; and generating at least one modified RTL block by removing at least a portion of at least the first predefined RTL block based on the control parameters; and outputting a design to be implemented in a programmable logic device using at least one modified RTL block.

Example Embodiment 17. The non-transitory computer-readable medium of embodiment 16, wherein the instructions cause the first processor to determine the options of the control parameters based on determining at least one of an unused portion of at least the first predefined RTL block due to the unused portion corresponding to an unused sub-function of at least the first predefined RTL block that is unused in performing the first function.

Example Embodiment 18. The non-transitory computer-readable medium of embodiment 16, wherein the instructions cause the first processor to the options of the control parameters based on determining at least one of an redundant portion of at least the first predefined RTL block to perform the function.

Example Embodiment 19. The non-transitory computer-readable medium of embodiment 16, wherein the instructions cause the first processor to cause the at least one modified RTL block to be implemented on a programmable logic circuit.

Example Embodiment 20. The non-transitory computer-readable medium of embodiment 16, wherein the instructions cause the first processor to:

receiving software associated with performing a second function by a second processor; and replace at least a sub-function of the second function with an alternative sub-function performed in the programmable logic device instead of using instructional set architecture (ISA) of the second processor by altering the design of the second processor to remove the at least a sub-function of the second function.

What is claimed is:

1. A data processing system, comprising:

a memory storing code describing a plurality of predefined instruction set architecture (ISA) units, wherein each ISA unit comprises one or more instructions; and a first processor executing instructions to:

receive software associated with performing a function using a second processor;

determine one or more predefined ISA units to be used by the second processor based on the software;

determine one or more extraneous instructions of at least one predefined ISA unit of the one or more predefined ISA units based at least in part on the software; and generate a design for a processor circuit of the second processor by removing the one or more extraneous instructions to cause the second processor to use a reduced-set ISA unit rather than the at least one predefined ISA unit to perform the function by implementing the design.

2. The data processing system of claim 1, wherein the one or more extraneous instructions comprises unused instructions of the at least one predefined ISA unit for performing the function.

3. The data processing system of claim 1, wherein the one or more extraneous instructions comprises redundant instructions of the at least one predefined ISA unit associated with performing a redundant function that is capable of being performed using another instruction corresponding to the at least one predefined ISA unit.

4. The data processing system of claim 3, wherein removing the redundant instructions comprises removing instructions associated with a redundant circuit block.

5. The data processing system of claim 4, wherein the redundant circuit block comprises a counter circuit block.

6. The data processing system of claim 1, wherein generating the design comprises combining at least two instructions into a custom instruction to remove the one or more extraneous instructions.

7. The data processing system of claim 1, wherein the first processor generates a software image based on receiving the software to determine the one or more predefined ISA units.

8. The data processing system of claim 1, wherein the first processor generates the design using reduced resources of the second processor compared to implementing unmodified versions of the one or more predefined ISA units on the second processor.

9. The data processing system of claim 1, wherein the first processor analyzes the software using simulation to determine the one or more predefined ISA units.

10. A method, comprising:

storing, by a first processor, code describing a plurality of predefined instruction set architecture (ISA) units, wherein each ISA unit comprises one or more instructions;

receiving, by the first processor, software associated with performing a function on a second processor;

determining, by the first processor, one or more predefined ISA units of the plurality of predefined ISA units to be used by the second processor based at least in part on the received software; and generating, by the first processor, a modified ISA unit based on replacing at least one instruction of at least one predefined ISA unit of the one or more predefined ISA units with one or more alternative instructions to replace a function of the at least one instruction with a function of the one or more alternative instructions when executed on the second processor.

11. The method of claim 10, wherein the modified ISA unit is implemented using fewer resources of the second processor than the at least one predefined ISA unit.

12. The method of claim 10, comprising simulating the software to determine the one or more predefined ISA units.

13. The method of claim 10, wherein the first processor generates the modified ISA unit based on removing one or more extraneous instructions of the corresponding predefined ISA unit of the at least one predefined ISA unit.

14. The method of claim 13, wherein the one or more extraneous instructions comprise unused instructions, redundant instructions, or both in the corresponding predefined ISA unit when performing the function.

15. The method of claim 10, wherein the first processor generates a design of logic circuitry on the second processor by implementing the modified ISA unit.

16. A non-transitory computer-readable medium comprising computer-executable instructions that, when executed, are configured to cause a first processor to:

receive program code associated with performing a first function;

provide first configuration settings and control parameters to a memory based on the program code, wherein the first configuration settings are associated with selecting at least a first predefined register transfer level (RTL) block of one or more predefined RTL blocks stored on the memory, and the control parameters are associated with options associated with removing unused portions of at least the first predefined RTL block based on the program code; and generate at least one modified RTL block by removing at least a portion of at least the first predefined RTL block based on the control parameters; and output a design to be implemented in a programmable logic device using the at least one modified RTL block.

17. The non-transitory computer-readable medium of claim 16, wherein the instructions cause the first processor to determine the options of the control parameters based on determining at least one of an unused portion of at least the first predefined RTL block due to the unused portion corresponding to an unused sub-function of at least the first predefined RTL block that is unused in performing the first function.

18. The non-transitory computer-readable medium of claim 16, wherein the instructions cause the first processor to determine the options of the control parameters based on determining at least one of a redundant portion of at least the first predefined RTL block.

19. The non-transitory computer-readable medium of claim 16, wherein the instructions cause the first processor to cause the at least one modified RTL block to be implemented on a programmable logic circuit.

20. The non-transitory computer-readable medium of claim 16, wherein the instructions cause the first processor to:

receive software associated with performing a second function by a second processor; and replace at least a sub-function of the second function with an alternative sub-function performed in the programmable logic device instead of using instructional set architecture (ISA) of the second processor by altering the design of the second processor to remove the at least a sub-function of the second function.

* * * * *